(12) United States Patent
Sukekawa

(10) Patent No.: US 11,171,140 B2
(45) Date of Patent: Nov. 9, 2021

(54) SEMICONDUCTOR MEMORY DEVICE AND METHOD OF FORMING THE SAME

(71) Applicant: MICRON TECHNOLOGY, INC., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/823,241

(22) Filed: Mar. 18, 2020

(65) Prior Publication Data

US 2021/0296319 A1 Sep. 23, 2021

(51) Int. Cl.
*H01L 27/108* (2006.01)
*G11C 11/402* (2006.01)

(52) U.S. Cl.
CPC ...... *H01L 27/1085* (2013.01); *G11C 11/4023* (2013.01); *H01L 27/10873* (2013.01); *H01L 27/10882* (2013.01)

(58) Field of Classification Search
None
See application file for complete search history.

(56) References Cited

U.S. PATENT DOCUMENTS

| 5,698,869 | A | * | 12/1997 | Yoshimi | ............ | H01L 27/1203 |
|-----------|----|---|---------|---------|--------------|--------------|
|           |    |   |         |         |              | 257/192      |
| 10,103,053 | B1 |  | 10/2018 | Sukekawa |          |              |
| 10,504,961 | B2 |  | 12/2019 | Sukekawa |          |              |

OTHER PUBLICATIONS

U.S. Appl. No. 16/354,450 titled "Integrated Assemblies Comprising Memory Cells Ad Shielding Material Between the Memory Cells, and Methods of Forming Integrated Assemblies" filed Mar. 15, 2019.

* cited by examiner

*Primary Examiner* — Anthony Ho
*Assistant Examiner* — Kevin Quinto
(74) *Attorney, Agent, or Firm* — Dorsey & Whitney LLP

(57) ABSTRACT

A semiconductor memory device including an access transistor configured as a vertical transistor comprises a channel portion and a pair of source/drain regions; a storage capacitor connected to one of the pair of source/drain regions; a bit line connected to the other of the pair of source/drain regions, a first semiconductor layer provided in the source/drain region to which the bit line is connected. Preferably, the first semiconductor layer comprises SiGe.

19 Claims, 7 Drawing Sheets

SEMICONDUCTOR MEMORY DEVICE AND METHOD OF FORMING THE SAME

BACKGROUND

Recently in semiconductor memory devices such as dynamic random access memory, increased memory capacity is desired, but increasing the memory capacity is difficult due to the finer processing dimensions. Accordingly, technology has been proposed in which a reduction of the planar area of the memory cells and an increase in the memory capacity are attained by a vertical structure of the access transistor in the memory cells.

BRIEF DESCRIPTION OF THE DRAWINGS

FIG. 1A is a cross section illustrating a diagrammatic configuration of a memory cell region in an exemplary process stage. FIG. 1B is a longitudinal section illustrating a diagrammatic configuration of a memory cell region in an exemplary process stage. FIG. 1A is a cross section illustrating the diagrammatic configuration of the portion along the line A-A in FIG. 1B. FIG. 1B is a longitudinal section illustrating a diagram of the portion along the line B-B in FIG. 1A.

FIG. 2A is a cross section illustrating a diagrammatic configuration of a memory cell region. FIG. 2B is a longitudinal section illustrating a diagrammatic configuration of a memory cell region. FIG. 2A is a cross section illustrating the diagrammatic configuration of the portion along the line A-A in FIG. 2B. FIG. 2B is a longitudinal section illustrating a diagram of the portion along the line B-B in FIG. 2A.

FIG. 3A is a cross section illustrating a diagrammatic configuration of a memory cell region. FIG. 3B is a longitudinal section illustrating a diagrammatic configuration of a memory cell region. FIG. 3A is a cross section illustrating the diagrammatic configuration of the portion along the line A-A in FIG. 3B. FIG. 3B is a longitudinal section illustrating a diagram of the portion along the line B-B in FIG. 3A.

FIG. 4A is a cross section illustrating a diagrammatic configuration of a memory cell region. FIG. 4B is a longitudinal section illustrating a diagrammatic configuration of a memory cell region. FIG. 4A is a cross section illustrating the diagrammatic configuration of the portion along the line A-A in FIG. 4B. FIG. 4B is a longitudinal section illustrating a diagram of the portion along the line B-B in FIG. 4A.

FIG. 5A is a cross section illustrating a diagrammatic configuration of a memory cell region. FIG. 5B is a longitudinal section illustrating a diagrammatic configuration of a memory cell region. FIG. 5A is a cross section illustrating the diagrammatic configuration of the portion along the line A-A in FIG. 5B. FIG. 5B is a longitudinal section illustrating a diagram of the portion along the line B-B in FIG. 5A.

FIG. 6A is a cross section illustrating a diagrammatic configuration of a memory cell region. FIG. 6B is a longitudinal section illustrating a diagrammatic configuration of a memory cell region. FIG. 6A is a cross section illustrating the diagrammatic configuration of the portion along the line A-A in FIG. 6B. FIG. 6B is a longitudinal section illustrating a diagram of the portion along the line B-B in FIG. 6A.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor memory device and a method of manufacturing the same according to the embodiment will be described with reference to FIGS. 1A to 7. In the following description, dynamic random access memory (hereinafter referred to as DRAM) is given as an example of a semiconductor memory device 1. Also, in the following description, an X direction is the direction parallel to the word lines, a Y direction is the direction perpendicular to the X direction and parallel to the bit lines. Also, a Z direction is the direction perpendicular to an X-Y plane defined as the plane of a semiconductor substrate 2, and is also referred to as a first direction or a vertical direction.

Hereinafter, a method of manufacturing the semiconductor memory device 1 according to the embodiment will be described.

Figure 1A:
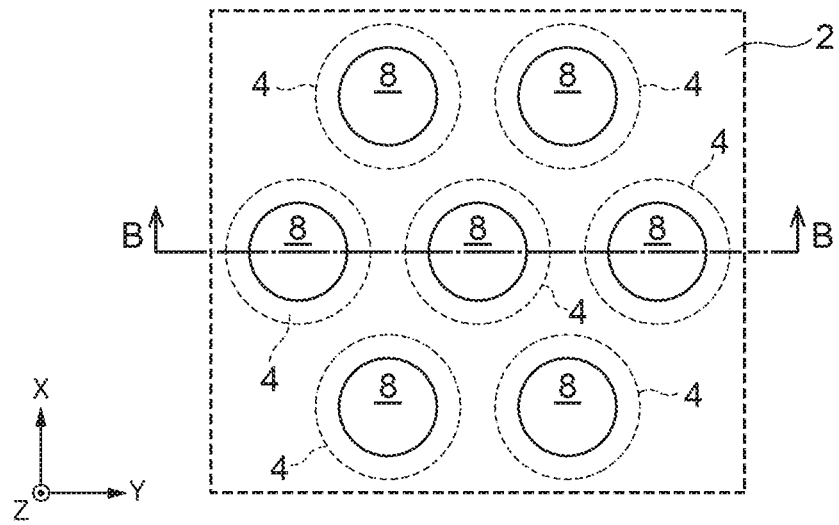
FIGS. 1A and 1B are diagrams illustrating a diagrammatic method of manufacturing a semiconductor memory device according to an embodiment.
Figure 1B:
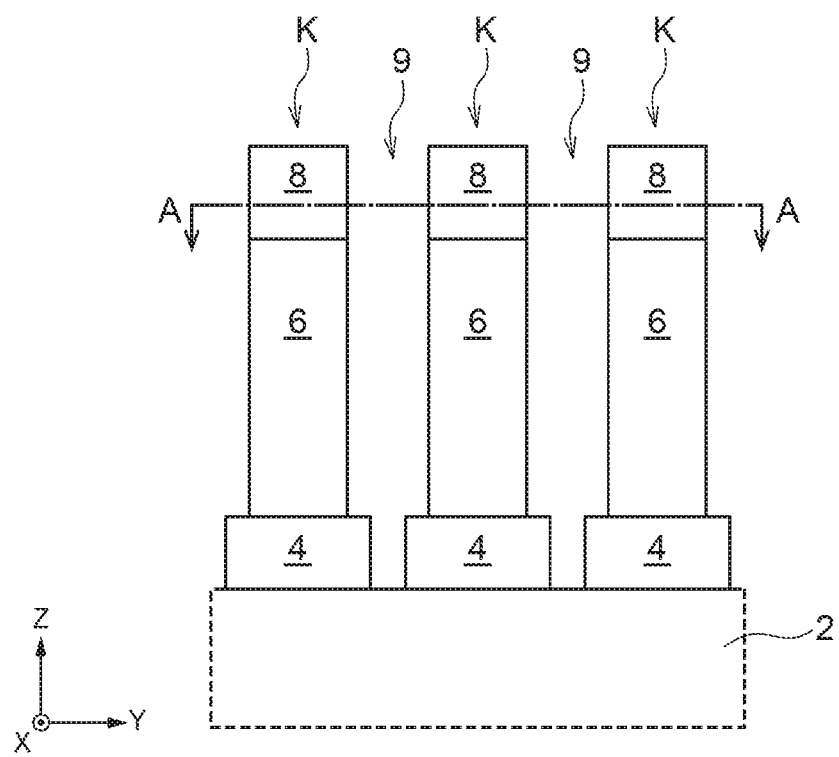

As illustrated in FIGS. 1A and 1B, a first semiconductor layer 4, a second semiconductor layer 6, and a first insulator layer 8 are stacked on a semiconductor substrate 2. Next, by patterning using known lithography technology and dry etching technology, a plurality of pillar structures K extending in the vertical direction and disposed independently of each other on the semiconductor substrate 2 are formed. The pillar structures K are stacks of the first semiconductor layer 4, the second semiconductor layer 6, and the first insulator layer 8.

The semiconductor substrate 2 is a disc-shaped single-crystal silicon wafer provided with a principal plane that has been given a mirror finish, for example. The first semiconductor layer 4 includes silicon germanium (SiGe) for example. The first semiconductor layer 4 can be formed by epitaxial growth, for example. The SiGe forming the first semiconductor layer 4 has a germanium (Ge) content from 20% to 30%. The first semiconductor layer 4 acts as one of a pair of source/drain regions of the DRAM access transistor described later. Note that in DRAM, because the source and the drain of the access transistor switch roles when writing and reading data, herein, the pair of the source region and the drain region of a transistor is designated the source/drain regions.

The second semiconductor layer 6 may include silicon (Si) for example. The second semiconductor layer 6 can be formed by epitaxial growth, for example. The first insulator layer 8 may include silicon nitride (SiN) for example. The first insulator layer 8 is formed by chemical vapor deposition (hereinafter referred to as CVD) for example. Chemical vapor deposition will be referred to as CVD in the following description. Gaps 9 are provided between the pillar structures K including the first semiconductor layer 4, the second semiconductor layer 6, and the first insulator layer 8.

Figure 2A:
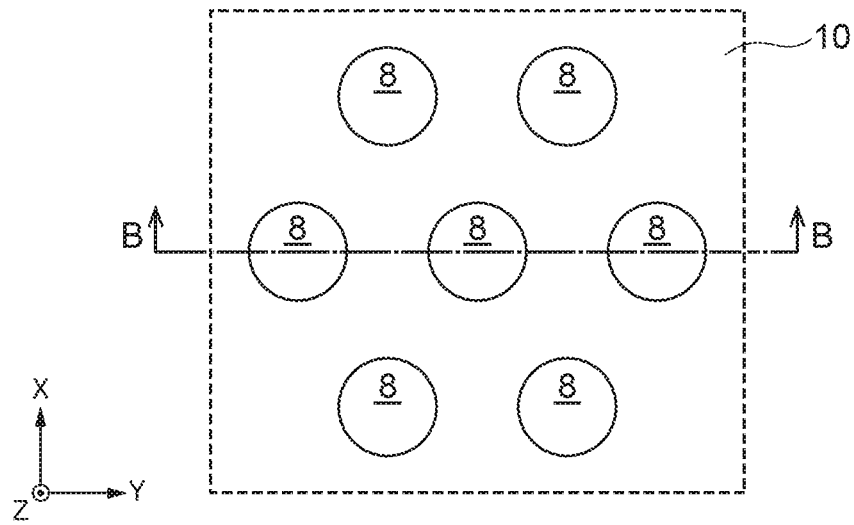
FIGS. 2A and 2B are diagrams illustrating a diagrammatic method of manufacturing the semiconductor memory device according to the embodiment, and illustrate schematic views in an exemplary process stage following FIGS. 1A and 1B.
Figure 2B:
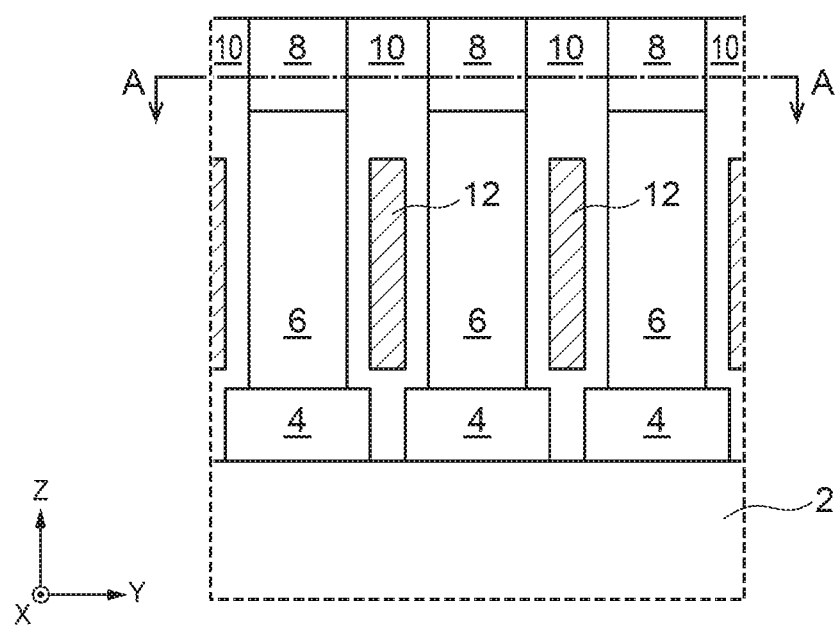

Next, as illustrated in FIGS. 2A and 2B, a second insulator layer 10 and a shield plate 12 are formed in each of the gaps 9 between the pillar structures K. The second insulator layer 10 includes silicon oxide ($SiO_2$) for example. The shield plate 12 includes polysilicon (poly-Si) doped with phosphorous (P) as an impurity. The second insulator layer 10 and the shield plate 12 can be formed by CVD for example. The shield plate 12 is surrounded by the second insulator layer 10 inside each gap 9.

Figure 3A:
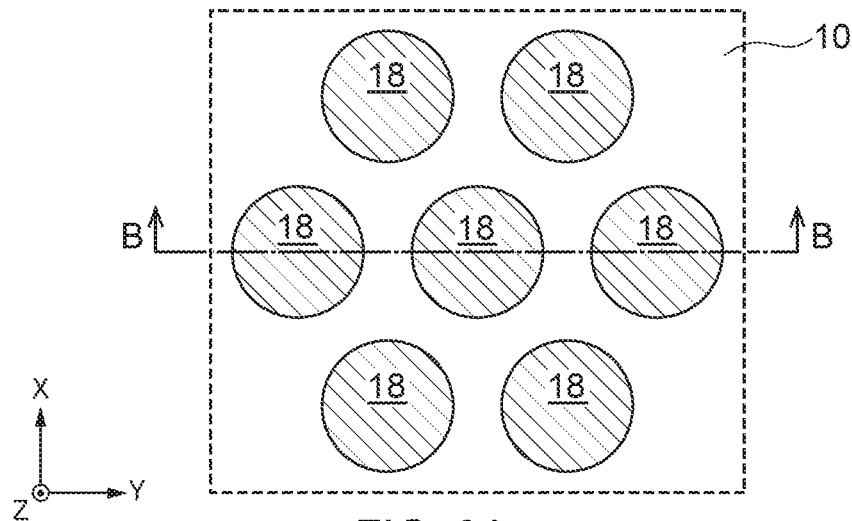
FIGS. 3A and 3B are diagrams illustrating a diagrammatic method of manufacturing the semiconductor memory device according to the embodiment, and illustrate schematic views in an exemplary process stage following FIGS. 2A and 2B.
Figure 3B:
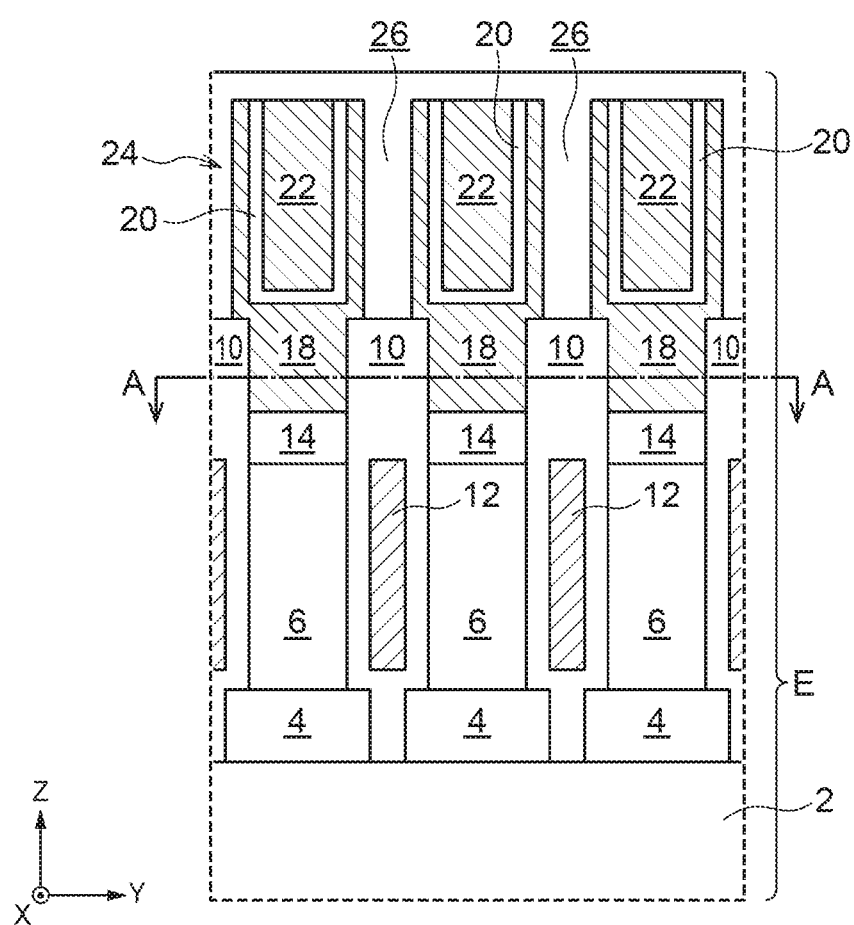

Next, as illustrated in FIGS. 3A and 3B, the first insulator layer 8 is selectively removed to expose the surface of the second semiconductor layer 6. The first insulator layer 8 can be selectively removed by etching using a hot phosphoric acid solution for example. After that, a doped portion 14 is formed by doping the exposed portion of the second semiconductor layer 6 with phosphorous (P) as an impurity for example. Doping with phosphorous can be achieved by ion implantation for example. As described later, the doped portion 14 acts as a source/drain regions of the DRAM access transistor.

Next, a lower electrode 18, a capacitive insulating film 20, and an upper electrode 22 are formed. The lower electrode 18 and the upper electrode 22 include titanium nitride (TiN) for example. The lower electrode 18 and the upper electrode 22 can be formed by CVD for example. The capacitive insulating film 20 includes a high-k film having a high dielectric constant. A high-k film includes a metallic oxide containing a metal such as zirconium (Zr) or aluminum (Al), for example.

With this arrangement, a storage capacitor 24 connected to the doped portion 14 and extending in the first direction is formed. After that, a third insulator layer 26 is formed, and the storage capacitor 24 is covered by the third insulator layer 26. The third insulator layer 26 can be formed using a silicon oxide layer for example. The third insulator layer 26 is formed by CVD for example.

Figure 4A:
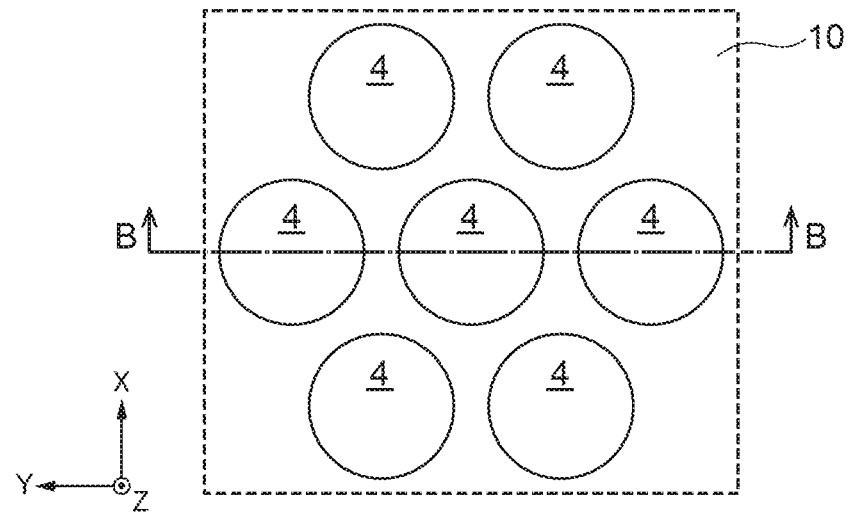
FIGS. 4A and 4B are diagrams illustrating a diagrammatic method of manufacturing the semiconductor memory device according to the embodiment, and illustrate schematic views in an exemplary process stage following FIGS. 3A and 3B.
Figure 4B:
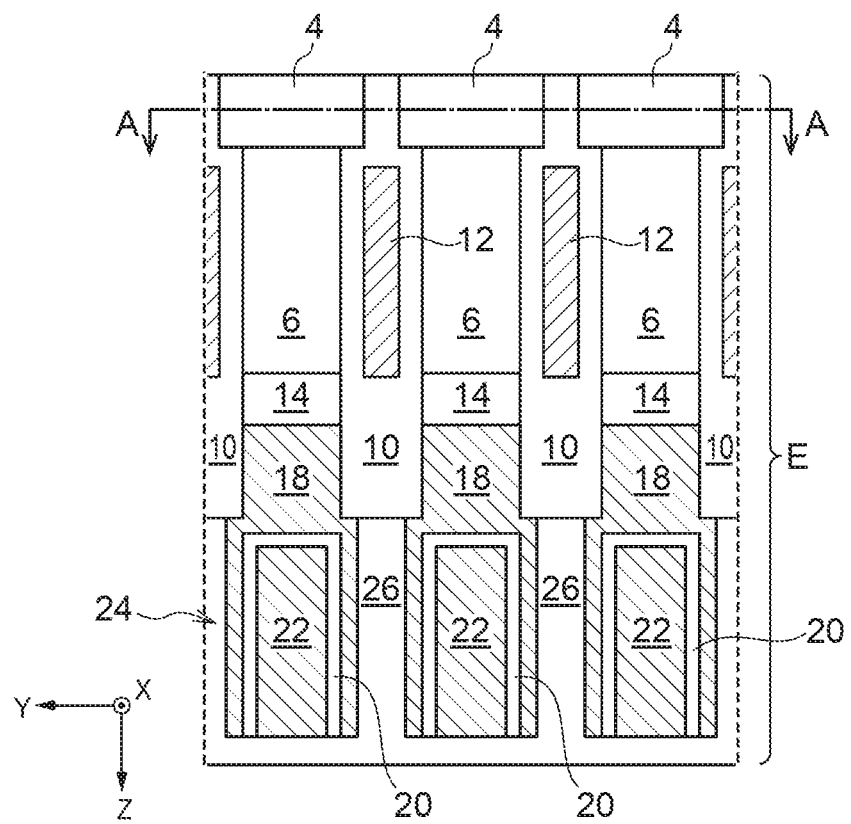

Next, as illustrated in FIGS. 4A and 4B, the semiconductor substrate 2 is inverted front to back or flipped upside down, and the semiconductor substrate 2 is removed by etching. Note that FIG. 4B as well as FIGS. 5B and 6B described later are drawn upside down relative to FIGS. 1B, 2B, and 3B referenced in the foregoing description. In the etching step, in the case where single-wafer etching is not used, or in other words, in the case of performing etching by dipping the semiconductor substrate 2 in an etching bath, it is sufficient to invert the semiconductor substrate 2 front-to-back in the step described using FIGS. 5A and 5B described later.

The etching of the semiconductor substrate 2, or in other words the etching of silicon, is performed using tetramethylammonium hydroxide (TMAH) diluted in water or an ammonia aqueous solution (NH3(aq)) diluted in water, for example. The etching of the semiconductor substrate 2 is stopped at the point when the surface of the first semiconductor layer 4 is exposed. The etching amount of the semiconductor substrate 2 is controlled by the etching time.

Here, the first semiconductor layer 4 includes SiGe. Furthermore, the SiGe forming the first semiconductor layer 4 has a Ge content from 20% to 30%. By the SiGe formed in this way, a high selectivity ratio with respect to silicon can be set in the etching of silicon by TMAH diluted in water or an ammonia aqueous solution diluted in water. For this reason, in the etching of silicon by TMAH diluted in water or an ammonia aqueous solution, the SiGe functions as a favorable etching stopper.

Consequently, the etching of silicon can be performed uniformly, and variations in the etching amount can be suppressed.

Figure 5A:
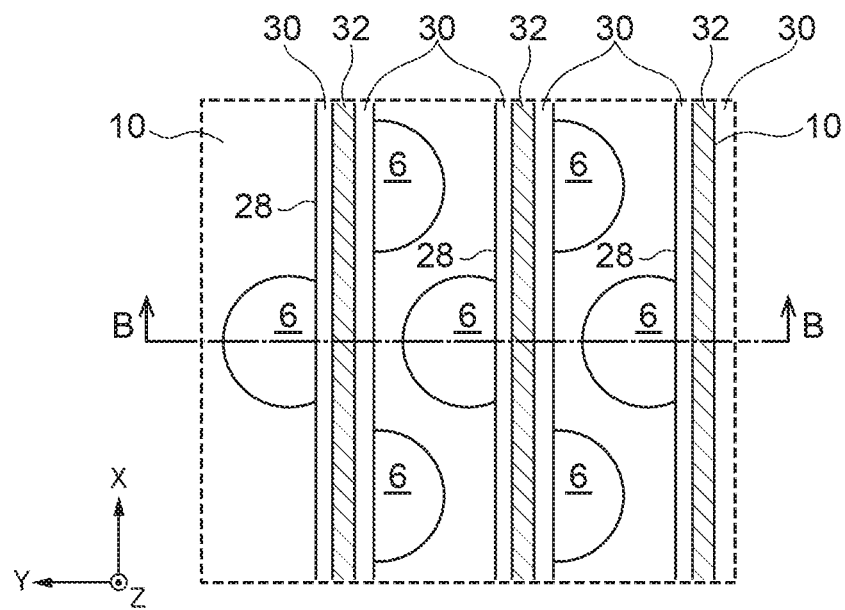
FIGS. 5A and 5B are diagrams illustrating a diagrammatic method of manufacturing the semiconductor memory device according to the embodiment, and illustrate schematic views in an exemplary process stage following FIGS. 4A and 4B.
Figure 5B:
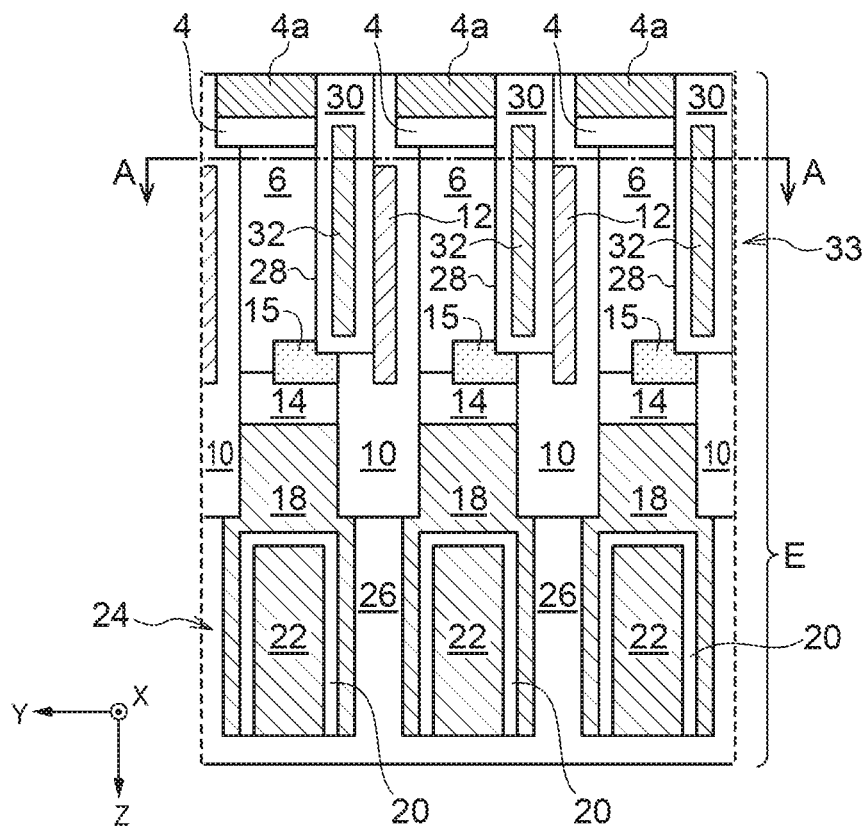

Next, as illustrated in FIGS. 5A and 5B, by doping a part of the first semiconductor layer 4 with phosphorous (F) for example as an impurity while the semiconductor substrate 2 is inverted front to back, a doped portion 4a doped with phosphorous is formed. Doping with phosphorous can be performed by ion implantation for example.

Next, a trench reaching the doped portion 14 from the first semiconductor layer 4 side is formed between the second semiconductor layer 6 and the shield plate 12. A trench 28 is formed extending in the Z direction. After that, phosphorous for example is implanted into the doped portion 14 positioned in the floor of the trench 28 by ion implantation, and an extended doped portion 15 is formed. The trench 28 can be formed using known lithography technology and dry etching technology. The doped portion 14 and the extended doped portion 15 function as the source/drain regions of an access transistor 33, which is a vertical transistor described later. The extended doped portion 15 functions as an extension of the source/drain regions of the access transistor 33.

Next, a gate insulating film 30 and a gate electrode 32 are formed, and the gate insulating film 30 and the gate electrode 32 are buried in the trench 28. The gate insulating film 30 includes a silicon oxide film for example. The gate electrode 32 includes a conductive material such as titanium nitride, for example. The gate insulating film 30 and the gate electrode 32 can be formed by CVD for example. With this arrangement, the gate electrode 32 in contact with the side surface of the second semiconductor layer 6 that acts as a channel portion through the gate insulating film 30 can be formed.

Figure 6A:
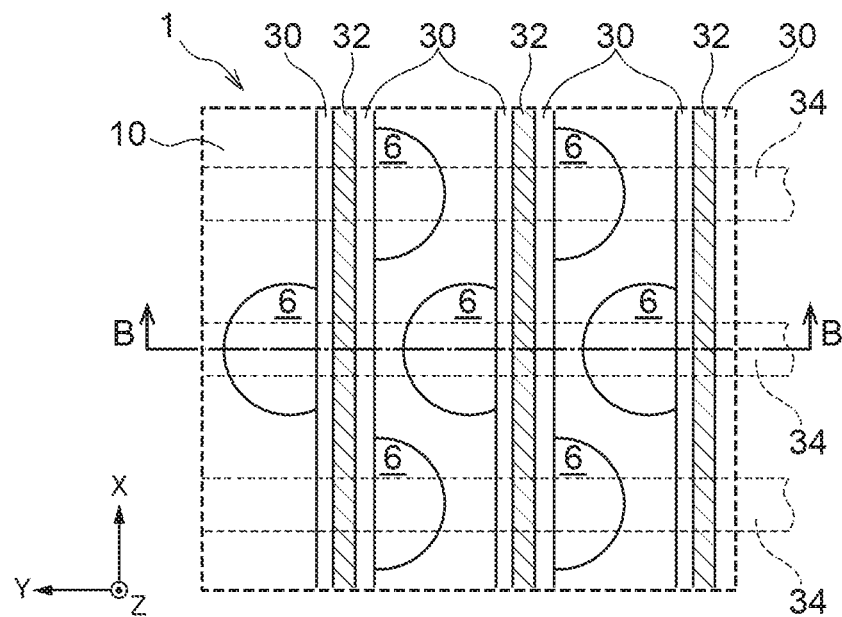
FIGS. 6A and 6B are diagrams illustrating a diagrammatic configuration and a diagrammatic method of manufacturing the semiconductor memory device according to the embodiment, and illustrate schematic views in an exemplary process stage following FIGS. 5A and 5B.
Figure 6B:
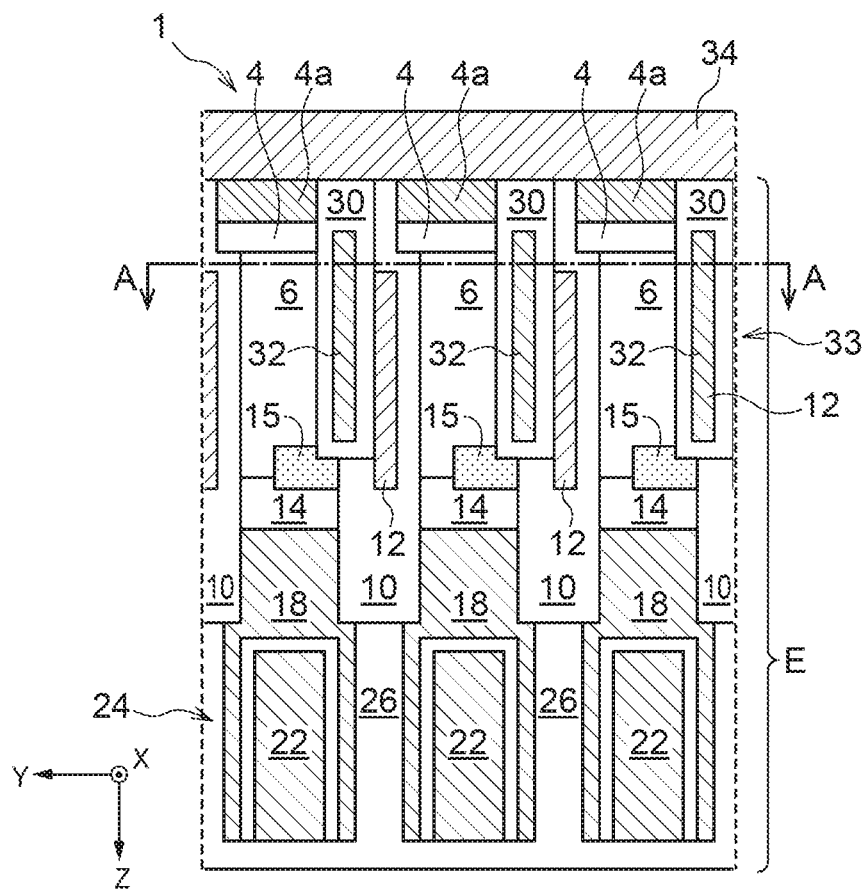

Next, as illustrated in FIGS. 6A and 6B, a plurality of bit lines 34 extending in the Y direction are formed. The bit lines 34 include a conductive material including any of WSi, WN, W, or the like, for example. By causing the bit lines 34 to abut the first semiconductor layer 4, the bit lines 34 are electrically connected to the first semiconductor layer 4.

By the above steps, it is possible to form the semiconductor memory device 1 that includes the access transistor 33 having a configuration in which the first semiconductor layer 4, the doped portion 4a, the second semiconductor layer 6, the doped portion 14, and the extended doped portion 15 are arranged side by side in the Z direction. The access transistor 33 is formed as a vertical metal-oxide-semiconductor field-effect transistor (MOSFET) whose channel portion formed in the second semiconductor layer 6 extends in the Z direction, that is, the vertical direction. Hereinafter, a transistor whose channel portion is formed in the vertical direction and whose source/drain regions are disposed above and below the channel portion is referred to as a vertical transistor.

Also, by the above steps, it is possible to achieve a configuration in which the access transistor 33 and the storage capacitor 24 are vertically stacked in the Z direction. With this arrangement, the area occupied by the memory cells in the X-Y plane can be reduced, and a highly integrated semiconductor memory device 1 can be achieved.

Also, the DRAM access transistor 33 is formed by the above steps. The first semiconductor layer 4 including the doped portion 4a, and also the extended doped portion 15 and the doped portion 14 function as the source/drain regions of the access transistor 33. The gate electrode 32 functions as the gate electrode of the access transistor 33. The gate electrode 32 functions as a word line of the semiconductor memory device 1. The second semiconductor layer 6 functions as the channel portion of the access transistor 33. The second semiconductor layer 6 forming the channel portion of the access transistor 33 is surrounded by an insulating film, except for the portions connecting to the first semiconductor layer 4 and the doped portion 14. Consequently, the access transistor 33 is a fully-depleted or partially-depleted SOI transistor. The shield plate 12 is connected to a predetermined electric potential, and functions as an isolation that electrically isolates the access transistor 33.

In the access transistor 33, the first semiconductor layer 4 that acts as the source/drain regions includes SiGe. If SiGe is used to form the source/drain regions of the access transistor 33 that is a MOSFET having a structure in which the second semiconductor layer 6 that acts as the channel portion is surrounded by an insulator, a floating body effect of the channel portion can be suppressed. This is because the band gap of SiGe is narrower than that of silicon, and therefore even if holes are produced in the channel portion, the holes easily pass through the second semiconductor layer 6 and escape to the bit lines 34, lessening the degree of the voltage drop in the channel portion. In other words, providing an SiGe layer on the bit line contact side lowers the potential barrier, and the floating body effect of the access transistor 33 is suppressed. Consequently, in the case of using the access transistor 33 in which the first semiconductor layer 4 that acts as the source/drain region connected to the bit line 34 includes SiGe, the write characteristics and read characteristics of the semiconductor memory device 1 become favorable, and a high-performance semiconductor memory device 1 can be achieved.

Also, by using SiGe to form the first semiconductor layer 4, the contact resistance with the bit lines 34 can be reduced.

Also, by the above steps, a memory cell structure provided with the bit lines 34, the gate electrode 32, the access transistor 33, and the storage capacitor 24 is formed. The memory cell structure corresponds to a structure E illustrated in FIG. 7 described later.

Figure 7:
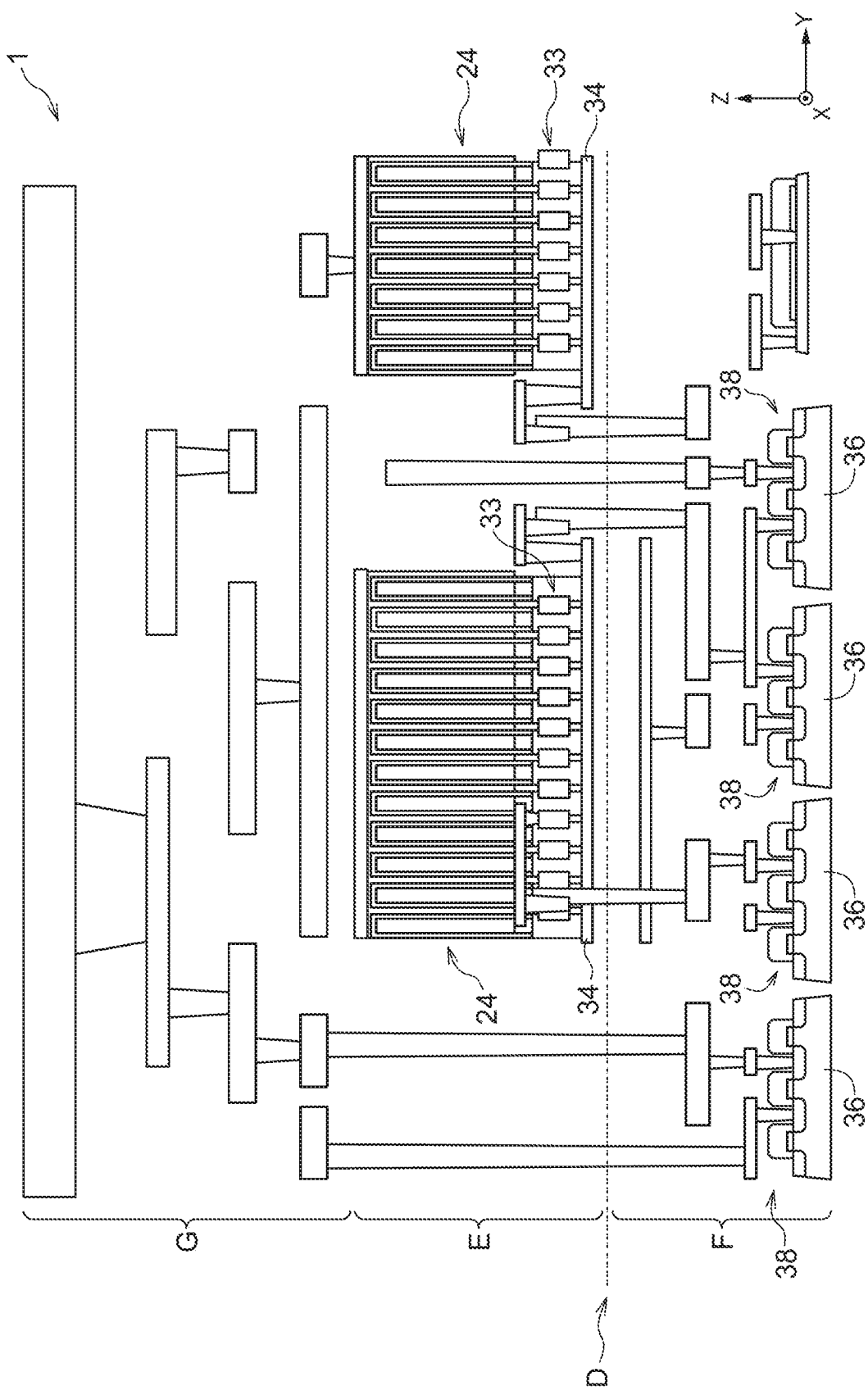
FIG. 7 is a longitudinal section illustrating a diagrammatic overall configuration of the semiconductor memory device according to the embodiment.

FIG. 7 is a longitudinal section schematically illustrating an overall configuration of the semiconductor memory device 1 including the above memory cell structure E. As illustrated in FIG. 7, the semiconductor memory device 1 includes the memory cell structure E, a peripheral circuit portion F, and an interconnect portion G.

The memory cell structure E forms the memory cell portion of the semiconductor memory device 1, and is provided with a plurality of gate electrodes 32 (word lines), bit lines 34, access transistors 33, and storage capacitors 24. The memory cell structure E illustrated in FIG. 7 is disposed upside down relative to the semiconductor memory device 1 illustrated in FIGS. 6A and 6B.

The peripheral circuit portion F is provided with peripheral circuits for driving the memory cells. The peripheral circuits include CMOS transistors 38 formed on semiconductor substrates 36. The surfaces of the semiconductor substrates 36 provide a face parallel to the X-Y plane, and the CMOS transistors 38 are formed on the surfaces of the semiconductor substrates 36. The interconnect portion G is provided with a wiring layer including a plurality of interconnects.

The semiconductor memory device 1 is obtained by joining the memory cell structure E and the peripheral circuit portion F at a junction plane D, and additionally forming the interconnect portion G. In the semiconductor memory device 1 according to the embodiment, the peripheral circuit portion F and the memory cell structure E are stacked in the Z direction. The channel direction of the access transistors 33 extends in the direction perpendicular to the semiconductor substrates 36. Also, the longitudinal direction of the storage capacitors 24 is perpendicular to the semiconductor substrates 36. For this reason, it is possible to reduce the planar area occupied by the memory cells and the peripheral circuits, and the chip area of the semiconductor memory device 1 can be reduced.

Consequently, a semiconductor memory device 1 with lowered costs can be provided.

As above, DRAM is described as an example of the semiconductor memory device 1 according to the embodiment, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor memory device 1. Furthermore, devices other than memory, including logic ICs such as a microprocessor and an application-specific integrated circuit (ASIC) for example are also applicable as the semiconductor memory device 1 according to the foregoing embodiment.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. A semiconductor memory device comprising:
a first semiconductor layer including a doped portion;
a second semiconductor layer on the first semiconductor layer opposite to the first doped portion the second semiconductor layer including a second doped portion on a surface opposite to the first semiconductor layer;

an access transistor configured as a vertical transistor comprising:
  a channel portion in second semiconductor layer, the channel portion on the first semiconductor layer; and
  a pair of source/drain regions including:
    one of the pair of source/drain region on the first doped portion; and
    another of the pair of source/drain regions in the second doped portion;
  a storage capacitor connected to the other of the pair of source/drain regions;
  a bit line connected to the one of the pair of source/drain regions.

2. The semiconductor memory device of claim 1, wherein the bit line comprises a conductive material comprising any of WSi, WN, and W.

3. The semiconductor memory device of claim 1, wherein the channel portion is surrounded by an insulating material.

4. The semiconductor memory device of claim 1, wherein the second semiconductor layer comprises silicon provided by an epitaxial growth method.

5. The semiconductor memory device of claim 1, further comprising:
  a gate insulating film provided in contact with the channel portion; and
  a gate electrode comprising conductive material,
  wherein the gate electrode faces the channel portion with the gate insulating film interposed therebetween.

6. The semiconductor memory device of claim 1, wherein the first semiconductor layer comprises SiGe.

7. The semiconductor memory device of claim 2, wherein the Ge content of the first semiconductor layer is 20% by weight to 30% by weight.

8. A method of manufacturing a semiconductor memory device comprising a pair of source/drain regions, a channel portion disposed between the source/drain regions and surrounded by an insulator, a vertical transistor comprising a gate electrode opposed to the channel portion via a gate insulating film, and a storage capacitor connected to one of the source/drain regions, the method comprising:
  forming a plurality of pillar structures extending on a semiconductor substrate in a first direction perpendicular to the semiconductor substrate, each pillar structure comprising, as a stack structure, a first semiconductor layer comprising one of the source/drain regions, a second semiconductor layer comprising the channel portion, and a first insulator layer,
  removing the first insulator layer to expose the second semiconductor layer,
  forming the other of the source/drain regions by doping the exposed second semiconductor layer with an impurity;
  forming a storage capacitor connected to the other of the source/drain regions and extending in the first direction;
  removing the semiconductor substrate by etching using the first semiconductor layer as an etching stopper to expose the first semiconductor layer; and
  forming a gate insulating film and a gate electrode in contact with the side surface of the second semiconductor layer.

9. The method of claim 8, wherein the first semiconductor layer is formed by an epitaxial growth method.

10. The method of claim 8, wherein the second semiconductor layer is formed by an epitaxial growth method.

11. The method of claim 8, wherein removing the semiconductor substrate by etching is performed using tetramethylammonium hydroxide diluted with water or an ammonia aqueous solution.

12. The method of claim 8, wherein the first semiconductor layer comprises SiGe.

13. The method of claim 12, wherein the Ge content of the first semiconductor layer is 20% by weight to 30% by weight.

14. The method of claim 8, further comprising: forming a bit line connected to the first semiconductor layer.

15. The method of claim 14, wherein the bit line comprises a conductive material comprising any of WSi, WN, and W.

16. A method of manufacturing a semiconductor memory device comprising:
  forming a plurality of pillar structures extending on a semiconductor substrate in a first direction perpendicular to the semiconductor substrate, each pillar structure comprising, as a stack structure, a first semiconductor layer, a second semiconductor layer, and a first insulator layer;
  forming a second insulator layer and a shield plate between the pillar structures;
  removing the first insulator layer to expose the second semiconductor layer;
  doping the second semiconductor layer with an impurity to form a doped portion;
  forming a storage capacitor connected to the exposed second semiconductor layer and extending in the first direction;
  removing the semiconductor substrate by etching to expose the first semiconductor layer;
  forming a trench reaching the doped portion from the first semiconductor layer side between each of the second semiconductor layer and the shield plate;
  forming a gate insulating film and a gate electrode in the trench; and
  forming a bit line connected to the first semiconductor layer.

17. The method of claim 16, wherein removing the semiconductor substrate by etching is performed using tetramethylammonium hydroxide diluted with water or an ammonia aqueous solution.

18. The method of claim 16, wherein the first semiconductor layer comprises SiGe.

19. The method of claim 18, wherein the Ge content of the first semiconductor layer is 20% by weight to 30% by weight.

* * * * *

UNITED STATES PATENT AND TRADEMARK OFFICE
CERTIFICATE OF CORRECTION

PATENT NO.         : 11,171,140 B2                                              Page 1 of 1
APPLICATION NO.    : 16/823241
DATED              : November 9, 2021
INVENTOR(S)        : Sukekawa It is certified that error appears in the above-identified patent and that said Letters Patent is hereby corrected as shown below:

In the Claims

| | Reads | Should Read |
|---|---|---|
| Column 6, Line 63 | "including a doped portion" | -- including a first doped portion -- |
| Column 6, Line 65 | "first doped portion the second semiconductor layer" | -- first doped portion, the second semiconductor layer -- |
| Column 7, Line 6 | "one of the pair of source/drain region on the first doped portion" | -- one of the pair of source/drain region in the first doped portion -- |

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*